(12) United States Patent
Liu et al.

(10) Patent No.: US 11,923,485 B2
(45) Date of Patent: Mar. 5, 2024

(54) OPTICAL DEVICE

(71) Applicant: GRIREM ADVANCED MATERIALS CO., LTD, Beijing (CN)

(72) Inventors: Ronghui Liu, Beijing (CN); Yuanhong Liu, Beijing (CN); Xiaoxia Chen, Beijing (CN); Yuan Xue, Beijing (CN); Xiaole Ma, Beijing (CN)

(73) Assignee: GRIREM ADVANCED MATERIALS CO., LTD., Beijing (CN)

( * ) Notice: Subject to any disclaimer, the term of this patent is extended or adjusted under 35 U.S.C. 154(b) by 117 days.

(21) Appl. No.: 17/254,228

(22) PCT Filed: Aug. 22, 2019

(86) PCT No.: PCT/CN2019/102047
§ 371 (c)(1),
(2) Date: Dec. 18, 2020

(87) PCT Pub. No.: WO2021/031203
PCT Pub. Date: Feb. 25, 2021

(65) Prior Publication Data
US 2022/0173282 A1 Jun. 2, 2022

(51) Int. Cl.
*H01L 33/50* (2010.01)
*C09K 11/77* (2006.01)

(52) U.S. Cl.
CPC ........ *H01L 33/504* (2013.01); *C09K 11/7708* (2013.01); *C09K 11/77347* (2021.01); *C09K 11/77348* (2021.01); *C09K 11/7774* (2013.01); *C09K 11/7776* (2013.01)

(58) Field of Classification Search
CPC .......... H01L 33/504; Y02B 20/00; F21V 9/40
See application file for complete search history.

(56) References Cited

U.S. PATENT DOCUMENTS

| 2021/0015052 A1* | 1/2021 | Li | A01G 7/045 |
| 2022/0173281 A1* | 6/2022 | Liu | G02B 5/208 |

* cited by examiner

*Primary Examiner* — Antonio B Crite
(74) *Attorney, Agent, or Firm* — Westbridge IP LLC

(57) ABSTRACT

An optical device includes an LED chip, a visible-light luminescent material, and a near-infrared luminescent material, wherein a luminous power of light emitted by the near-infrared and visible-light luminescent materials in a band of 650-1000 nm under the excitation of the LED chip is A, and a sum of a luminous power of light emitted by the near-infrared and visible-light luminescent materials in a band of 350-650 nm under the excitation of the LED chip and a luminous power of residual light emitted by the LED chip in the band of 350-650 nm after the LED chip excites the near-infrared and visible-light luminescent materials is B, with B/A*100% being 0.1%-10%. According to the implementation where the optical device employs the LED chip to combine the near-infrared luminescent material and the visible-light luminescent material simultaneously.

15 Claims, 1 Drawing Sheet

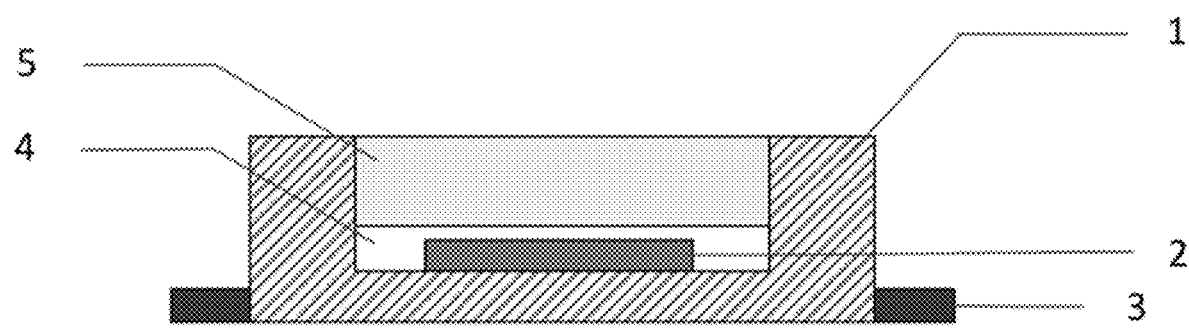

OPTICAL DEVICE

CROSS-REFERENCE TO RELATED APPLICATIONS

This Application is a national stage application of PCT/CN2019/102047. This application claims priorities from PCT Application No. PCT/CN2019/102047, filed Aug. 22, 2019, and from the Chinese patent application 201910779651.8 filed Aug. 22, 2019, the content of which is incorporated herein in the entirety by reference.

TECHNICAL FIELD

The present invention relates to the field of infrared optics technologies, and in particular to an optical device including an LED chip, a visible-light luminescent material, and a near-infrared luminescent material.

BACKGROUND

In recent years, the application of near-infrared light in the fields of security monitoring, biometric identification, 3D sensing, and food/medical testing has become a focus at home and abroad. Due to good directivity, low power consumption, small size and a number of other advantages, near-infrared LEDs have become an international research hotspot. At present, the near-infrared LEDs are mainly implemented by means of near-infrared semiconductor chips. For example, infrared chips in bands of 730 nm, 750 nm, 850 nm and 940 nm are mainly applied in the security field. In particular, short-wave infrared chips will bring about very serious red-light bursts during usage. In general, one or more white-light LEDs are further provided externally to compensate for light during the detection in low light and reduce the red-light bursts caused by the infrared chips. In this implementation, a drive current for a white-light LED bead is greatly different from that for an infrared LED bead, which affects the service life of the whole light-emitting device. In addition, the infrared chips are relatively expensive, and the process of packaging with a plurality of infrared chips is complex and is high in cost, which limits the application and promotion of infrared LED optical devices.

A method for packaging by combining an LED chip with a near-infrared luminescent material has the advantages of simple preparation process, low cost, high luminous efficiency and the like. Moreover, the near-infrared luminescent material is rich in emission wavelength, and can produce various specific wavelengths for near-infrared applications. At present, a major problem of this implementation is that the luminous power of near-infrared light still needs to be further improved, and the luminous power of white light is difficult to adjust in a controllable way. As a result, a perfect and soft visual effect can hardly be presented.

SUMMARY

An objective of the present invention is to provide an optical device that combines an LED chip, a visible-light luminescent material, and a near-infrared luminescent material. The optical device emits near-infrared light and visible light simultaneously at high efficiency by using the same type of LED chip, which greatly simplifies a packaging process, reduces the packaging cost, and meanwhile, makes it possible to adjust and control a white-light component in a spectrum. As a result, an effect of eliminating the red-light bursts can be achieved on the one hand, and a soft visual effect can be presented on the other hand. To achieve the above objective of the present invention, the present invention has the following technical solutions.

An optical device includes an LED chip, a visible-light luminescent material, and a near-infrared luminescent material, wherein a luminous power of light emitted by the near-infrared and visible-light luminescent materials in a band of 650-1000 nm under the excitation of the LED chip is A;

a sum of a luminous power of light emitted by the near-infrared and visible-light luminescent materials in a band of 350-650 nm under the excitation of the LED chip and a luminous power of residual light emitted by the LED chip in the band of 350-650 nm after the LED chip excites the near-infrared and visible-light luminescent materials is B; and B/A*100% is 0.1%-10%.

The LED chip in the present invention is the same type of LED chip, such as a blue-light LED chip. One or a plurality of blue-light LED chips may coexist to enhance the luminous power of the emitted near-infrared light.

Preferably, the LED chip in the optical device has a peak-emission wavelength in a range of 420-470 nm; and a mixture of the light emitted by the visible-light and near-infrared luminescent materials under the excitation of the LED chip and the residual light of the LED chip after the excitation has a color temperature of 1000-5000 K.

Preferably, the near-infrared luminescent material includes one of molecular formulas including $aSc_2O_3 \cdot A_2O_3 \cdot bCr_2O_3$ and $Ln_2O_3 \cdot cE_2O_3 \cdot dCr_2O_3$, the element A containing at least one of elements Al and Ga and necessarily containing the element Ga, the element Ln containing at least one of elements Y, Lu and Gd and necessarily containing the element Y, and the element E containing at least one of elements Al and Ga and necessarily containing the element Ga, with $0.001 \leq a \leq 0.6$, $0.001 \leq b \leq 0.1$, $1.5 \leq c \leq 2$, and $0.001 \leq d \leq 0.2$; and the two molecular formulas have a $\beta$-$Ga_2O_3$ structure and a garnet structure, respectively.

Preferably, the visible-light luminescent material has a molecular formula containing one or two of luminescent materials with general formulas of $M_{1-e}AlSiN_3:Eu^{2+}_e$ and $M_{2-f}Si_5N_8:Eu^{2+}_f$, the element M containing at least one or two of Ca and Sr, with $0.0001 \leq e \leq 0.1$ and $0.0001 \leq f \leq 0.1$.

Preferably, the visible-light luminescent material has a peak-emission wavelength of 600-670 nm.

Preferably, the visible-light luminescent material has a peak-emission wavelength of 610-620 nm.

Preferably, a mixture of the light emitted by the visible-light and near-infrared luminescent materials under the excitation of the LED chip of the optical device and the residual light of the LED chip after the excitation has a color temperature of 1400-3000 K.

Preferably, the near-infrared luminescent material has a mass accounting for 90-99.9% of a sum of the mass of the near-infrared luminescent material and a mass of the visible-light luminescent material.

Preferably, the near-infrared luminescent material has a median grain size D50 of 22-30 μm, and the visible-light luminescent material has a median grain size D50 of 10-20 μm.

Preferably, the visible-light luminescent material is located between an LED chip layer and the near-infrared luminescent material and covered by the near-infrared luminescent material.

Preferably, the visible-light luminescent material applied to a luminescent surface of the LED chip in a vertical direction has a mass accounting for 10-30% of a total mass of the visible-light luminescent material.

In summary, the present invention provides an optical device, which includes an LED chip, a visible-light luminescent material, and a near-infrared luminescent material, wherein a luminous power of light emitted by the near-infrared and visible-light luminescent materials in a band of 650-1000 nm under the excitation of the LED chip is A, and a sum of a luminous power of light emitted by the near-infrared and visible-light luminescent materials in a band of 350-650 nm under the excitation of the LED chip and a luminous power of residual light emitted by the LED chip in the band of 350-650 nm after the LED chip excites the near-infrared and visible-light luminescent materials is B, with B/A*100% being 0.1%-10%.

Compared with the prior art, the present invention has the following beneficial effects:

(1) according to the implementation where the optical device employs the LED chip to combine the near-infrared luminescent material and the visible luminescent material, the emissions of near-infrared light and visible light are simultaneously enabled by using the same type of LED chip, which greatly simplifies a packaging process and reduces the packaging cost;

(2) the optical device has the characteristics of high luminous efficiency, excellent reliability, strong anti-jamming capability, no red-light bursts and the like; and (3) the optical device with the combination of the visible light and the near-infrared light according to the present invention makes it possible to adjust and control the luminous power of a white-light part, can achieve a soft visual effect, and has good application prospects in security monitoring and other fields.

BRIEF DESCRIPTION OF THE DRAWINGS

FIG. 1 illustrates a schematic diagram of a light-emitting device according to a preferred embodiment of the present invention.

Reference signs: 1—rack, 3—semiconductor chip, 3—pin, 4—visible—light fluorescent layer, 5—near—infrared fluorescent layer.

DETAILED DESCRIPTION

To present the objective, technical solutions and advantages of the present invention more clearly, the present invention will be further described in detail below in conjunction with specific embodiments and with reference to the accompanying drawings. It should be understood that these descriptions are merely for an illustrative purpose, and not intended to limit the scope of the present invention. In addition, the description of well-known structures and technologies is omitted in the following illustrations, in order to avoid unnecessarily obscuring the concept of the present invention.

The present invention provides an optical device that combines an LED chip, a visible-light luminescent material, and a near-infrared luminescent material. The optical device emits near-infrared light and visible light simultaneously at high efficiency by using the same type of LED chip, which greatly simplifies a packaging process, reduces the packaging cost, and meanwhile, makes it possible to adjust and control a white-light component in a spectrum. As a result, an effect of eliminating red-light bursts can be achieved on the one hand, and a soft visual effect can be presented in the other hand. To achieve the above objective of the present invention, the present invention has the following technical solutions.

An optical device includes an LED chip, a visible-light luminescent material, and a near-infrared luminescent material, wherein a luminous power of light emitted by the near-infrared and visible-light luminescent materials in a band of 650-1000 nm under the excitation of the LED chip is A, and a sum of a luminous power of light emitted by the near-infrared and visible-light luminescent materials in a band of 350-650 nm under the excitation of the LED chip and a luminous power of residual light emitted by the LED chip in the band of 350-650 nm after the LED chip excites the near-infrared and visible-light luminescent materials is B, with B/A*100% being 0.1%-10%.

The light emitted in the band of 350-650 nm in the optical device mainly plays a role of weakening the red-light bursts brought about by the light emitted in the band of 650-1000 nm. However, a strong visual impact may be caused when the luminous power of the light emitted in the band of 350-650 nm is excessively high, resulting in dizziness induced by the white light. Therefore, B/A*100% is implemented as 0.1%-10% according to the present invention.

Preferably, the LED chip in the optical device has a peak-emission wavelength in a range of 420-470 nm; and a mixture of the light emitted by the visible-light and near-infrared luminescent materials under the excitation of the LED chip and the residual light of the LED chip after the excitation has a color temperature of 1000-5000 K.

The purpose of controlling the color temperature of the optical device is to adjust the visual effect of the device. If the color temperature is too high, a light color may seem too cool, leading to an excessively strong visual impact. Preferably, the color temperature of the light mixture is 1000-5000 K.

Preferably, the near-infrared luminescent material includes one of molecular formulas including $aSc_2O_3 \cdot A_2O_3 \cdot bCr_2O_3$ and $Ln_2O_3 \cdot cE_2O_3 \cdot dCr_2O_3$. The element A contains at least one of elements Al and Ga and necessarily contains the element Ga; the element Ln contains at least one of elements Y, Lu and Gd and necessarily contains the element Y; and the element E contains at least one of elements Al and Ga and necessarily contains the element Ga, with $0.001 \leq a \leq 0.6$, $0.001 \leq b \leq 0.1$, $1.5 \leq c \leq 2$, and $0.001 \leq d \leq 0.2$. The two molecular formulas above have a $\beta$-$Ga_2O_3$ structure and a garnet structure, respectively.

Preferably, the near-infrared luminescent material of the $\beta$-$Ga_2O_3$ structure may further contain an element In.

The introduction of the element In in said near-infrared luminescent material of the $\beta$-Ga2O$_3$ structure may allow the luminescent performance of the near-infrared luminescent material to be further adjusted and controlled.

The two types of near-infrared luminescent materials described above have peak-emission wavelengths at 690 nm-870 nm and 690 nm-760 nm, respectively.

Preferably, the visible-light luminescent material has a molecular formula containing one or two of luminescent materials with general formulas of $M_{1-e}AlSiN_3:Eu^{2+}_e$ or $M_{2-f}Si_5N_8:Eu^{2+}_f$, the element M containing at least one or two of Ca and Sr, with $0.0001 \leq e \leq 0.1$ and $0.0001 \leq f \leq 0.1$.

To adjust the comprehensive properties such as color coordinates, color temperature, color rendering ability, and luminous power of the optical device, the visible-light luminescent material may further contain one or more of $(Ba,Ca,Sr)Si_2O_2N_2:Eu^{2+}$, $\beta$-$SiAlON:Eu^{2+}$, $(La,Y,Lu)_{3-e}Si_6N_{11}:eCe^{3+}$, and $(Lu,Y,Gd)_{3-z}(Al,Ga)_5O_{12}:zCe^{3+}$, in order to adjust light color parameters of the optical device. Each element in the brackets of the molecular formulas may exist alone or as two or three elements in coexistence, which is mainly directed to adjust properties such as emission wavelength, peak width at half height and luminous intensity of the visible-light luminescent material.

Preferably, the visible-light luminescent material has a peak-emission wavelength of 600-670 nm.

Preferably, the visible-light luminescent material has a peak-emission wavelength of 610-620 nm.

As for the visible light emitted by the visible-light luminescent material under the excitation of the LED chip, from one aspect, it can be combined with residual light of the LED chip to produce soft visible light for weakening red-light bursts caused by the emitted near-infrared light; and from another aspect, the light emitted in this band may be further absorbed by the near-infrared luminescent material to enhance the luminous power of the near-infrared luminescent material. In view of an effective absorption band for the near-infrared luminescent material and in order to achieve a soft visual effect, the visible-light luminescent material preferably has a peak-emission wavelength of 610-620 nm.

Preferably, a mixture of the light emitted by the visible-light and near-infrared luminescent materials under the excitation of the LED chip of the optical device and the residual light of the LED chip after the excitation has a color temperature of 1400-3000 K.

A softer visual effect can be achieved when the mixture of the light emitted by the visible-light and near-infrared luminescent materials under the excitation of the LED chip of the optical device above and the residual light of the LED chip after the excitation has a color temperature of 1400-3000 K.

Preferably, the near-infrared luminescent material has a mass accounting for 90-99.9% of a sum of the mass of the near-infrared luminescent material and a mass of the visible-light luminescent material.

Preferably, the near-infrared luminescent material has a median grain size D50 of 22-30 μm, and the visible-light luminescent material has a median grain size D50 of 10-20 μm.

The median grain size D50 of the near-infrared luminescent material directly contributes to the luminescent performance in an infrared band. Preferably, the near-infrared luminescent material has the median grain size D50 of 22-30 μm, which may significantly enhance the intensity of the luminous power in the infrared band, and prevent oversize grains from affecting the transmission effectiveness of the infrared light, thereby reducing the luminous power of the near-infrared light. The visible-light luminescent material has a median grain size D50 less than that of the near-infrared luminescent material, which may effectively reduce the usage amount of visible-light fluorescent powder and reduce the blocking to light emitted by the LED chip. Meanwhile, to guarantee the luminous efficiency of the visible-light luminescent material, the visible-light luminescent material preferably has a median grain size D50 of 10-20 μm.

Preferably, the visible-light luminescent material is located between an LED chip layer and the near-infrared luminescent material and covered by the near-infrared luminescent material.

Preferably, the visible-light luminescent material applied to a luminescent surface of the LED chip in a vertical direction has a mass accounting for 10-30% of a total mass of the visible-light luminescent material.

The visible-light luminescent material is located between the LED chip layer and the near-infrared luminescent material and covered by the near-infrared luminescent material. In this way, from one aspect, the visible-light luminescent material may effectively absorb the light emitted by the LED chip to achieve a high luminous power for the emitted visible light; and from another aspect, the visible-light luminescent material covered by the near-infrared luminescent material may allow the near-infrared luminescent material to effectively absorb the emitted visible light, thereby enhancing the luminous power of the near-infrared luminescent material. The visible light of the visible-light luminescent material remained after being absorbed by the near-infrared luminescent material may be combined with the residual light of the LED chip to produce soft visible light.

In addition, the protection scope of the present invention is not limited to the forms of the specific molecular formulas involved in all the materials described above, and fine-tuning the range of an element content to achieve an effect similar to that achieved according to the present invention shall be still deemed as falling within the protection scope claimed by the present patent application. For example, fine-tuning the element contents in the molecular formula $(La,Y,Lu)_3Si_6N_{11}:Ce^{3+}$ in the ranges of 2-4, 5-7 and 8-13 respectively to achieve a similar inventive effect shall be still deemed as falling within the protection scope of the present patent for invention.

Preparation Method

There is no limit to the specific method for preparing the optical device according to the present invention. However, the optical performance of the optical device may be improved with the following preparation methods.

An LED chip is fixed on a rack and a heat sink, and then a circuit is well soldered. Powdered materials of the visible-light and near-infrared luminescent materials according to the present invention are evenly mixed with silica gel or resin at a ratio respectively or simultaneously, and then stirred and defoamed to obtain a fluorescent conversion layer material, which is dispensed or sprayed to cover the LED chip layer, and then cured by baking. Finally, packaging is performed to obtain the desired LED light-emitting device. Alternatively, the powdered materials of the visible-light and near-infrared luminescent materials are prepared into fluorescent glass or fluorescent ceramic, which is then combined with the LED chip and packaged to obtain the light-emitting device according to the present invention.

The following provides examples and embodiments of the present invention merely for a purpose of illustrating the near-infrared optical device involved in the present invention. However, the present invention is not limited to these examples or embodiments.

Embodiment 1

An optical device included the following component parts: a blue-light LED chip with a wavelength of 440 nm, a visible-light luminescent material with a molecular formula of $Ca_{0.1}Sr_{0.89}AlSiN_3:0.01Eu^{2+}$, and a near-infrared luminescent material with a molecular formula of $Y_2O_3.1.6Ga_2O_3.0.06Cr_2O_3$, wherein the near-infrared luminescent material had a mass accounting for 99% of the total mass of all the luminescent materials, and had a grain size D50 of 26 μm; and the visible-light luminescent material had a grain size D50 of 15 μm. The visible-light luminescent material according to the present invention was evenly mixed with silica gel, stirred and defoamed to obtain a visible-light fluorescent conversion layer mixture, which was applied to cover a surface of an LED chip layer, and then cured by baking to form a visible-light fluorescent layer, wherein the visible-light luminescent material applied to a luminescent surface of the LED chip in a vertical direction had a mass accounting for 20% of a total mass of the visible-light luminescent material. Then, the near-infrared luminescent material was evenly mixed with the silica gel, applied to cover an upper surface of the visible-light fluorescent conversion layer, and then cured. Packaging was then performed to obtain the desired LED light-emitting device. A lighting test was performed with 1000 mA current, and said light-emitting device had a white-light luminous flux of 3.9 lm, a total luminous power of 735 mW in a band of 350 nm-1000 nm, a luminous power A of 720 mW in a band of 650 nm-1000 nm, and a luminous power B of 15 mW in a band of 350 nm-650 nm, and a color temperature of 2123 K, with a luminous power ratio B/A*100%=2.1%.

The optical devices in Embodiments 2 and 3 have the same structure as that of the optical device in Embodiment 1 but slightly different in preparation method, in which the visible-light luminescent material in the present invention was evenly mixed with silica gel, stirred and defoamed to obtain a visible-light fluorescent conversion layer mixture, which was then sprayed to evenly cover a surface of the LED chip. The near-infrared luminescent material and the visible-light luminescent material in respective embodiments were mixed at their respective ratios according to their molecular formulas and performance characteristics to obtain the visible-light fluorescent conversion layer mixture.

Embodiment 4

An optical device included the following component parts: a blue-light LED chip with a wavelength of 460 nm, a visible-light luminescent material with a molecular formula of $Ca_{0.49}Sr_{0.49}AlSiN_3:0.02Eu^{2+}$, and a near-infrared luminescent material with a molecular formula of $Y_2O_3 \cdot 1.8Ga_2O_3 \cdot 0.06Cr_2O_3$, wherein the near-infrared luminescent material had a mass accounting for 93.6% of the total mass of all the luminescent materials, and had a grain size D50 of 24 μm; and the visible-light luminescent material had a grain size D50 of 12 μm. The visible-light luminescent material according to the present invention was evenly mixed with silica gel, stirred and defoamed to obtain a visible-light fluorescent conversion layer mixture, which was dispensed to cover a surface of an LED chip layer, and then cured by baking to form a visible-light fluorescent layer, wherein the visible-light luminescent material applied to a luminescent surface of the LED chip in a vertical direction had a mass accounting for 10% of a total mass of the visible-light luminescent material. Then, the near-infrared luminescent material was evenly mixed with the silica gel, applied to cover an upper surface of the visible-light fluorescent conversion layer, and then cured. Packaging was then performed to obtain the desired LED light-emitting device. A lighting test was performed with 1000 mA current, and said light-emitting device had a white-light luminous flux of 5.6 lm, a total luminous power of 691 mW in a band of 350 nm-1000 nm, a luminous power A of 658 mW in a band of 650 nm-1000 nm, a luminous power B of 33 mW in a band of 350 nm-650 nm, and a color temperature of 2816 K, with a luminous power ratio B/A*100%=5%.

The preparation methods and the structures of the light-emitting devices in Embodiments 5 and 6 are the same as those in Embodiment 4, and may be obtained just by mixing the near-infrared luminescent material and the visible-light luminescent material in respective embodiments at their respective ratios according to their molecular formulas and performance characteristics.

Embodiment 7

An optical device included the following component parts: a blue-light LED chip with a wavelength of 420 nm, a visible-light luminescent material with a molecular formula of $Ca_{0.1}Sr_{0.89}AlSiN_3:0.01Eu^{2+}$, and a near-infrared luminescent material with a molecular formula of $(Y_{0.5}Lu_{0.5})_2O_3 \cdot 1.6Ga_2O_3 \cdot 0.06Cr_2O_3$, wherein the near-infrared luminescent material had a mass accounting for 99.99% of the total mass of all the luminescent materials, and had a grain size D50 of 25 μm; and the visible-light luminescent material had a grain size D50 of 15 μm. The visible-light luminescent material according to the present invention was evenly mixed with silica gel, stirred and defoamed to obtain a visible-light fluorescent conversion layer mixture, which was dispensed to cover a surface of an LED chip layer, and then cured by baking to form a visible-light fluorescent layer, wherein the visible-light luminescent material applied to a luminescent surface of the LED chip in a vertical direction had a mass accounting for 10% of a total mass of the visible-light luminescent material. Then, the near-infrared luminescent material was evenly mixed with the silica gel, applied to cover an upper surface of the visible-light fluorescent conversion layer, and then cured. Packaging was then performed to obtain the desired LED light-emitting device. A lighting test was performed with 1000 mA current, and said light-emitting device had a white-light luminous flux of 6.2 lm, a total luminous power of 692 mW in a band of 350 nm-1000 nm, a luminous power A of 680 mW in a band of 650 nm-1000 nm, a luminous power B of 12 mW in a band of 350 nm-650 nm, and a color temperature of 2560 K, with a luminous power ratio B/A*100%=1.8%.

The preparation method and the structure of the light-emitting device in Embodiment 8 are the same as those in Embodiment 7, and may be obtained just by mixing the near-infrared luminescent material and the visible-light luminescent material in respective embodiments at their respective ratios according to their molecular formulas and performance characteristics.

Embodiment 9

An optical device included the following component parts: a blue-light LED chip with a wavelength of 470 nm, a visible-light luminescent material with a molecular formula of $Ca_{0.1}Sr_{0.89}AlSiN_3:0.01Eu^{2+}$, and a near-infrared luminescent material with a molecular formula of $0.3Sc_2O_3 \cdot Ga_2O_3 \cdot 0.05Cr_2O_3$, wherein the near-infrared luminescent material had a mass accounting for 99% of a total mass of all the luminescent materials, and had a grain size D50 of 26 μm; and the visible-light luminescent material had a grain size D50 of 15 μm. The near-infrared and visible-light luminescent materials according to the present invention were blended into a glass material individually, and prepared into near-infrared fluorescent glass and visible-light fluorescent glass respectively; then the visible-light fluorescent glass was combined with the LED chip. The near-infrared fluorescent glass covered an upper layer of the near-infrared fluorescent glass. Packaging was then performed to obtain the optical device. The visible-light luminescent material applied to a luminescent surface of the LED chip in a vertical direction has a mass accounting for 30% of a total mass of the visible-light luminescent material. Finally, packaging was performed to obtain the desired LED light-emitting device. A lighting test was performed with 1000 mA current, and said light-emitting device had a white-light luminous flux of 5.4 lm, a total luminous power of 746 mW in a band of 350 nm-1000 nm, a luminous power A of 710 mW in a band of 650 nm-1000 nm, a luminous power B of 36 mW in a band of 350 nm-650 nm, and a color temperature of 2013 K, with a luminous power ratio B/A*100%=5%.

The optical devices in Embodiments 10 and 11 have the same structure as that of the optical device in Embodiment 9 but slightly different in preparation method, in which the near-infrared and visible-light luminescent materials in the present invention were respectively prepared into near-infrared fluorescent ceramic and visible-light fluorescent ceramic, which were then combined with the LED chip by arranging the near-infrared fluorescent ceramic to cover an upper layer of the visible-light fluorescent ceramic. Packaging was then performed to obtain the optical device.

Embodiment 12

An optical device included the following component parts: a blue-light LED chip with a wavelength of 450 nm, a visible-light luminescent material with a molecular formula of $Ca_{1.9}Si_5N_8:0.01Eu^{2+}$ and a near-infrared luminescent material with a molecular formula of $0.6Sc_2O_3.Ga_2O_3.0.05Cr_2O_3$, wherein the near-infrared luminescent material had a mass accounting for 99.4% of a total mass of all the luminescent materials, and had a grain size D50 of 24 μm; and the visible-light luminescent material had a grain size D50 of 12 μm. The near-infrared and visible-light luminescent materials in the present invention were blended into a silica gel material together to prepare a near-infrared and visible-light luminescent material mixture, which was then dispensed to cover an upper surface of the LED chip, cured by baking and then packaged to obtain the optical device, wherein the visible-light luminescent material applied to a luminescent surface of the LED chip in a vertical direction had a mass accounting for 50% of a total mass of the visible-light luminescent material. Finally, packaging was performed to obtain the desired LED light-emitting device. A lighting test was performed with 1000 mA current, and said light-emitting device had a white-light luminous flux of 10 lm, a total luminous power of 650 mW in a band of 350 nm-1000 nm, a luminous power A of 630 mW in a band of 650 nm-1000 nm, a luminous power B of 25 mW in a band of 350 nm-650 nm, and a color temperature of 2996 K, with a luminous power ratio B/A*100%=4%.

The preparation method and the structure of the light-emitting device in Embodiment 13 are the same as those in Embodiment 12, and may be obtained just by mixing the near-infrared luminescent material and the visible-light luminescent material in respective embodiments at their respective ratios according to their molecular formulas and performance characteristics.

Embodiment 14

An optical device included the following component parts: a blue-light LED chip with a wavelength of 480 nm, a visible-light luminescent material with a molecular formula of $Ca_{0.9}AlSiN_3:0.1Eu^{2+}$, and a near-infrared luminescent material with a molecular formula of $0.3Sc_2O_3.Ga_2O_3.0.1Cr_2O_3$, wherein the near-infrared luminescent material had a mass accounting for 97% of a total mass of all the luminescent materials, and had a grain size D50 of 30 μm; and the visible-light luminescent material had a grain size D50 of 20 μm. The visible-light luminescent material according to the present invention was evenly mixed with resin, stirred and defoamed to obtain a visible-light fluorescent conversion layer mixture, which was dispensed to cover a surface of an LED chip layer, and then cured by baking to form a visible-light fluorescent layer, wherein the visible-light luminescent material applied to a luminescent surface of the LED chip in a vertical direction had a mass accounting for 5% of a total mass of the visible-light luminescent material. Then, the near-infrared luminescent material was evenly mixed with silica gel, applied to cover an upper surface of the visible-light fluorescent conversion layer, and then cured. Packaging was then performed to obtain the desired LED light-emitting device. Finally, packaging was performed to obtain the desired LED light-emitting device. A lighting test was performed with 1000 mA current, and said light-emitting device had a white-light luminous flux of 5 lm, a total luminous power of 616 mW in a band of 350 nm-1000 nm, a luminous power A of 560 mW in a band of 650 nm-1000 nm, a luminous power B of 56 mW in a band of 350 nm-650 nm, and a color temperature of 3010 K, with a luminous power ratio B/A*100%=10%.

The preparation method and the structure of the light-emitting device in Embodiment 15 are the same as those in Embodiment 14, and may be obtained just by mixing the near-infrared luminescent material and the visible-light luminescent material in respective embodiments at their respective ratios according to their molecular formulas and performance characteristics.

Embodiment 16

An optical device included the following component parts: a blue-light LED chip with a wavelength of 400 nm, a visible-light luminescent material with a molecular formula of $Sr_{1.97}Si_5N_8:0.03Eu^{2+}$, and a near-infrared luminescent material with a molecular formula of $0.3Sc_2O_3.(Al_{0.5}Ga_{0.5})_2O_3.0.05Cr_2O_3$, wherein the near-infrared luminescent material had a mass accounting for 92.3% of a total mass of all the luminescent materials, and had a grain size D50 of 25 μm; and the visible-light luminescent material had a grain size D50 of 15 μm. The visible-light luminescent material according to the present invention was evenly mixed with silica gel, stirred and defoamed to obtain a visible-light fluorescent conversion layer mixture, which was sprayed to cover a surface of an LED chip layer, and then cured by baking to form a visible-light fluorescent layer, wherein the visible-light luminescent material applied to a luminescent surface of the LED chip in a vertical direction had a mass accounting for 5% of a total mass of the visible-light luminescent material. Then, the near-infrared luminescent material was evenly mixed with the silica gel, dispensed to cover an upper surface of the visible-light fluorescent conversion layer, and then cured. Packaging was then performed to obtain the desired LED light-emitting device. Finally, packaging was performed to obtain the desired LED light-emitting device. A lighting test was performed with 1000 mA current, and said light-emitting device had a white-light luminous flux of 16 lm, a total luminous power of 626 mW in a band of 350 nm-1000 nm, a luminous power A of 580 mW in a band of 650 nm-1000 nm, a luminous power B of 46 mW in a band of 350 nm-650 nm, and a color temperature of 2013 K, with a luminous power ratio B/A*100%=8%.

The preparation method and the structure of the light-emitting device in Embodiment 17 are the same as those in Embodiment 16, and may be obtained just by mixing the near-infrared luminescent material and the visible-light luminescent material in respective embodiments at their respective ratios according to their molecular formulas and performance characteristics.

Table 1 below shows the composition and luminescent performance of the near-infrared luminescent materials and the visible-light luminescent materials in all the embodiments of the present invention.

luminescent material can enable dual emission of the white light and the near-infrared light, and make it possible to effectively adjust and control the luminous power for the white light part and the near-infrared light. The optical device has good application prospects in security and other fields.

It should be understood that the foregoing specific embodiments of the present invention are merely for a purpose of illustrating or explaining the principle of the present invention by way of example, and not intended to limit the present invention. Therefore, any modifications,

TABLE 1

| Name | Visible-light material | Molecular formula of near-infrared luminescent material | Mass ratio of near-infrared luminescent material to all the luminescent materials | Median grain size of near-infrared luminescent material/nm | Median grain size of visible-light luminescent material/nm |
|---|---|---|---|---|---|
| Embodiment 1 | $Ca_{0.1}Sr_{0.89}AlSiN_3: 0.01Eu^{2+}$ | $Y_2O_3 \cdot 1.6Ga_2O_3 \cdot 0.06Cr_2O_3$ | 99% | 26 | 15 |
| Embodiment 2 | $Ca_{0.2}Sr_{0.79}AlSiN_3: 0.01Eu^{2+}$ | $Y_2O_3 \cdot 1.6Ga_2O_3 \cdot 0.06Cr_2O_3$ | 99.2% | 26 | 15 |
| Embodiment 3 | $Sr_{1.97}Si_5N_8: 0.03Eu^{2+}$ | $Y_2O_3 \cdot 1.6Ga_2O_3 \cdot 0.06Cr_2O_3$ | 99.5% | 24 | 18 |
| Embodiment 4 | $Ca_{0.49}Sr_{0.49}AlSiN_3: 0.02Eu^{2+}$ | $Y_2O_3 \cdot 1.8Ga_2O_3 \cdot 0.06Cr_2O_3$ | 93.6% | 24 | 12 |
| Embodiment 5 | $Ca_{0.55}Sr_{0.44}AlSiN_3: 0.01Eu^{2+}$ | $Y_2O_3 \cdot 1.5Ga_2O_3 \cdot 0.2Cr_2O_3$ | 92% | 28 | 18 |
| Embodiment 6 | $Ca_{0.992}AlSiN_3: 0.008Eu^{2+}$ | $Y_2O_3 \cdot 2.0Ga_2O_3 \cdot 0.001Cr_2O_3$ | 90% | 28 | 14 |
| Embodiment 7 | $Ca_{0.1}Sr_{0.89}AlSiN_3: 0.01Eu^{2+}$ | $(Y_{0.5}Lu_{0.5})_2O_3 \cdot 1.6Ga_2O_3 \cdot 0.06Cr_2O_3$ | 99.99% | 25 | 15 |
| Embodiment 8 | $Ca_{0.2}Sr_{0.79}AlSiN_3: 0.01Eu^{2+}$ | $Y_2O_3 \cdot 1.6(Al0.5Ga0.5)_2O_3 \cdot 0.06Cr_2O_3$ | 99.3% | 25 | 15 |
| Embodiment 9 | $Ca_{0.1}Sr_{0.89}AlSiN_3: 0.01Eu^{2+}$ | $0.3Sc_2O_3 \cdot Ga_2O_3 \cdot 0.05Cr_2O_3$ | 99% | 26 | 15 |
| Embodiment 10 | $Ca_{0.2}Sr_{0.79}AlSiN_3: 0.01Eu^{2+}$ | $0.3Sc_2O_3 \cdot Ga_2O_3 \cdot 0.05Cr_2O_3$ | 99.2% | 26 | 15 |
| Embodiment 11 | $Sr_{1.97}Si_5N_8: 0.03Eu^{2+}$ | $0.3Sc_2O_3 \cdot Ga_2O_3 \cdot 0.05Cr_2O_3$ | 99.6% | 24 | 18 |
| Embodiment 12 | $Ca_{1.9}Si_5N_8: 0.1Eu^{2+}$ | $0.6Sc_2O_3 \cdot Ga_2O_3 \cdot 0.05Cr_2O_3$ | 99.4% | 24 | 12 |
| Embodiment 13 | $Ca_{0.2}Sr_{0.79}AlSiN_3: 0.00Eu^{2+}$ | $0.3Sc_2O_3 \cdot Ga_2O_3 \cdot 0.001Cr_2O_3$ | 98% | 22 | 10 |
| Embodiment 14 | $Ca_{0.9}AlSiN_3: 0.1Eu^{2+}$ | $0.3Sc_2O_3 \cdot Ga_2O_3 \cdot 0.1Cr_2O_3$ | 97% | 30 | 20 |
| Embodiment 15 | $Sr_{0.95}AlSiN_3: 0.0001Eu^{2+}$ | $0.001Sc_2O_3 \cdot Ga_2O_3 \cdot 0.05Cr_2O_3$ | 95.5% | 15 | 30 |
| Embodiment 16 | $Sr_{1.97}Si_5N_8: 0.03Eu^{2+}$ | $0.3Sc_2O_3 \cdot (Al_{0.5}Ga_{0.5})_2O_3 \cdot 0.05Cr_2O_3$ | 92.3% | 25 | 15 |
| Embodiment 17 | $Lu_{2.94}(Al_{0.5}Ga_{0.5})_5O_{12}: 0.06Ce^{3+}$ | $0.3(Sc_{0.9}In_{0.1})_2O_3 \cdot Ga_2O_3 \cdot 0.05Cr_2O_3$ | 90% | 25 | 15 |

| Name | White-light luminous flux/nm | Luminous power in a band of 650 nm-1000 nm (A)/mW | Luminous power in a band of 350 nm-1000 nm/mW | Luminous power in a band of 350 nm-650 nm (B)/mW | Color temperature/K | B/A*100% |
|---|---|---|---|---|---|---|
| Embodiment 1 | 3.9 | 720 | 735 | 15 | 2123 | 2.1% |
| Embodiment 2 | 4.5 | 697 | 718 | 21 | 2064 | 3% |
| Embodiment 3 | 4.5 | 670 | 682 | 12 | 2491 | 1.8% |
| Embodiment 4 | 5.6 | 658 | 691 | 33 | 2816 | 5% |
| Embodiment 5 | 10 | 640 | 691 | 51 | 3020 | 6% |
| Embodiment 6 | 8 | 618 | 680 | 62 | 1406 | 3% |
| Embodiment 7 | 6.2 | 680 | 692 | 12 | 2560 | 1.8% |
| Embodiment 8 | 5.6 | 698 | 715 | 17 | 2980 | 2.5% |
| Embodiment 9 | 5.4 | 710 | 746 | 36 | 2013 | 5% |
| Embodiment 10 | 4.5 | 689 | 703 | 14 | 2022 | 2% |
| Embodiment 11 | 8.0 | 657 | 690 | 33 | 2509 | 5% |
| Embodiment 12 | 10 | 630 | 655 | 25 | 2996 | 4% |
| Embodiment 13 | 3 | 615 | 621 | 6 | 4046 | 1% |
| Embodiment 14 | 5 | 560 | 616 | 56 | 3010 | 2% |
| Embodiment 15 | 7 | 520 | 521 | 1 | 2030 | 0.1% |
| Embodiment 16 | 16 | 580 | 626 | 46 | 2013 | 8% |
| Embodiment 17 | 18 | 570 | 621 | 51 | 5030 | 10% |

As can be seen from Table 1 above, the data in the above table show that fluorescent powder in the optical device according to the present invention can be effectively excited by the LED chip; and the optical device combining the visible-light luminescent material and the near-infrared equivalent substitutions, improvements and the like made without departing from the spirit and scope of the present invention shall be included within the protection scope of the present invention. In addition, the appended claims of the present invention are intended to cover all variations and modifications that fall within the scope and boundary of the appended claims, or the equivalent forms of such scope and boundary.

The invention claimed is:

1. An optical device, comprising an LED chip, a visible-light luminescent material and a near-infrared luminescent material, wherein
a luminous power of light emitted by the near-infrared and visible-light luminescent materials in a band of 650-1000 nm under the excitation of the LED chip is A;
a sum of a luminous power of light emitted by the near-infrared and visible-light luminescent materials in a band of 350-650 nm under the excitation of the LED chip and a luminous power of residual light emitted by the LED chip in the band of 350-650 nm after the LED chip excites the near-infrared and visible-light luminescent materials is B; and
B/A*100% is 0.1%-10%; and
the LED chip in the optical device has a peak-emission wavelength in a range of 420-470 nm; and a mixture of the light emitted by the visible-light and near-infrared luminescent materials under the excitation of the LED chip and the residual light of the LED chip after the excitation has a color temperature of 1000-5000 K.

2. The optical device according to claim 1, wherein the visible-light luminescent material has a peak-emission wavelength of 600-670 nm.

3. The optical device according to claim 1, wherein the visible-light luminescent material has a peak-emission wavelength of 610-620 nm.

4. The optical device according to claim 1, wherein the visible-light luminescent material has a peak-emission wavelength of 610-620 nm.

5. The optical device according to claim 1, wherein the visible-light luminescent material has a molecular formula containing one or two of luminescent materials with general formulas of $M_{1-e}AlSiN_3:Eu^{2+}{}_e$ and $M_{2-f}Si_5N_8:Eu^{2+}{}_f$, the element M containing at least one or two of Ca and Sr, with $0.0001 \leq e \leq 0.1$ and $0.0001 \leq f \leq 0.1$.

6. The optical device according to claim 5, wherein the visible-light luminescent material has a peak-emission wavelength of 600-670 nm.

7. The optical device according to claim 1, wherein the visible-light luminescent material has a peak-emission wavelength of 610-620 nm.

8. The optical device according to claim 7, wherein a mixture of the light emitted by the visible-light and near-infrared luminescent materials under the excitation of the LED chip of the optical device and the residual light of the LED chip after the excitation has a color temperature of 1400-3000 K.

9. The optical device according to claim 1, wherein the near-infrared luminescent material has a mass accounting for 90-99.9% of a sum of the mass of the near-infrared luminescent material and a mass of the visible-light luminescent material.

10. The optical device according to claim 9, wherein the near-infrared luminescent material has a median grain size D50 of 22-30 μm, and the visible-light luminescent material has a median grain size D50 of 10-20 μm.

11. The optical device according to claim 1, wherein the visible-light luminescent material is located between an LED chip layer and the near-infrared luminescent material and covered by the near-infrared luminescent material.

12. The optical device according to claim 11, wherein the visible-light luminescent material applied to a luminescent surface of the LED chip in a vertical direction has a mass accounting for 10-30% of a total mass of the visible-light luminescent material.

13. The optical device according to claim 1, wherein the near-infrared luminescent material comprises one of molecular formulas comprising $aSc_2O_3 \cdot A_2O_3 \cdot bCr_2O_3$ and $Ln_2O_3 \cdot cE_2O_3 \cdot dCr_2O_3$, the element A containing at least one of elements Al and Ga and necessarily containing the element Ga, the element Ln containing at least one of elements Y, Lu and Gd and necessarily containing the element Y, and the element E containing at least one of elements Al and Ga and necessarily containing the element Ga, with $0.001 \leq a \leq 0.6$, $0.001 \leq b \leq 0.1$, $1.5 \leq c \leq 2$, and $0.001 \leq d \leq 0.2$; and the two molecular formulas have a $\beta\text{-}Ga_2O_3$ structure and a garnet structure, respectively.

14. The optical device according to claim 13, wherein the visible-light luminescent material has a molecular formula containing one or two of luminescent materials with general formulas of $M_{1-e}AlSiN_3:Eu^{2+}{}_e$ and $M_{2-f}Si_5N_8:Eu^{2+}{}_f$, the element M containing at least one or two of Ca and Sr, with $0.0001 \leq e \leq 0.1$ and $0.0001 \leq f \leq 0.1$.

15. The optical device according to claim 13, wherein the visible-light luminescent material has a peak-emission wavelength of 600-670 nm.

* * * * *